United States Patent [19]
Hsieh et al.

[11] Patent Number: 6,130,132
[45] Date of Patent: Oct. 10, 2000

[54] CLEAN PROCESS FOR MANUFACTURING OF SPLIT-GATE FLASH MEMORY DEVICE HAVING FLOATING GATE ELECTRODE WITH SHARP PEAK

[75] Inventors: Chia-Ta Hsieh, Tainan; Hung-Cheng Sung, Hsin-Chu; Yai-Fen Lin, Taichung; Di-Son Kuo, Hsinchu, all of Taiwan

[73] Assignee: Taiwan Semiconductor Manufacturing Company, Hsin-Chu, Taiwan

[21] Appl. No.: 09/055,439

[22] Filed: Apr. 6, 1998

[51] Int. Cl.[7] .................... H01L 21/336; H01L 21/3205
[52] U.S. Cl. .................... 438/264; 438/226; 438/283; 438/594
[58] Field of Search .................... 438/211, 197, 438/265, 257, 283, 264, 266, 592, 593

[56] References Cited

U.S. PATENT DOCUMENTS

| | | | |
|---|---|---|---|
| 4,868,629 | 9/1989 | Eitan | 357/45 |
| 5,349,220 | 9/1994 | Hong | 257/322 |
| 5,408,115 | 4/1995 | Chang | 257/324 |
| 5,422,301 | 6/1995 | Otsuki | 437/70 |
| 5,445,999 | 8/1995 | Thakur et al. | 437/242 |
| 5,478,767 | 12/1995 | Hong | 437/43 |
| 5,480,819 | 1/1996 | Huang | 437/43 |
| 5,492,854 | 2/1996 | Ando | 437/60 |
| 5,614,747 | 3/1997 | Ahn et al. | 257/316 |
| 5,915,178 | 6/1999 | Chiang et al. | 435/266 |
| 5,939,333 | 8/1999 | Hurley et al. | 437/241 |
| 5,940,706 | 8/1999 | Sung et al. | 438/261 |

*Primary Examiner*—Matthew Smith
*Assistant Examiner*—Lex H Malsawma
*Attorney, Agent, or Firm*—George O. Saile; Stephen B. Ackerman; Graham J. Jones, II

[57] ABSTRACT

The following steps are used to form a split gate electrode MOS FET device. Form a tunnel oxide layer over a semiconductor substrate. Over the tunnel oxide layer, form a doped first polysilicon layer with a top surface upon which a native oxide forms. Then as an option, remove the native oxide layer. On the top surface of the first polysilicon layer, form a silicon nitride layer and etch the silicon nitride layer to form it into a cell-defining layer. Form a polysilicon oxide dielectric cap over the top surface of the first polysilicon layer. Aside from the polysilicon oxide cap, etch the first polysilicon layer and the tunnel oxide layer to form a floating gate electrode stack in the pattern of the masking cap forming a sharp peak on the periphery of the floating gate electrode. Form spacers on the sidewalls of the gate electrode stack. Then form blanket inter-polysilicon dielectric and blanket control gate layers covering exposed portions of the substrate and covering the stack. Pattern the inter-polysilicon dielectric and control gate layers into a split gate electrode pair. Form a source region self-aligned with the floating gate electrode stack; perform a tungsten silicide anneal; and form a drain region self-aligned with the control gate electrodes.

20 Claims, 12 Drawing Sheets

CLEAN PROCESS FOR MANUFACTURING OF SPLIT-GATE FLASH MEMORY DEVICE HAVING FLOATING GATE ELECTRODE WITH SHARP PEAK

BACKGROUND OF THE INVENTION

1. Field of the Invention

This invention relates to formation of memory devices and more particularly to a method of forming a split-gate EPROM, flash memory device having a floating gate electrode with a sharp polysilicon peak.

2. Description of Related Art

U.S. Pat. No. 5,445,999 of Thakur et al. for "Advanced Technique to Improve the Bonding Arrangement on Silicon Surfaces to Promote Uniform Nitridation" describes formation of a native oxide layer on a substrate with silicon molecular clusters. Radiant energy is used in the presence of a reactive gas to convert silicon molecular clusters and already dangling bonds into a uniform dangling bond configuration on a silicon or polysilicon substrate.

U.S. Pat. No. 5,492,854 of Ando for "A Method of Forming a Semiconductor Device" describes a process including forming a capacitor with a lower electrode composed of polysilicon. The device is heated in an atmosphere containing a $SiH_4$ gas to remove a native oxide film on a surface of the lower electrode. Then a silicon nitride film is formed in an atmosphere excluding oxygen.

U.S. Pat. No. 5,614,747 of Ahn et al. for "Method for Manufacturing a Flash EEPROM Cell" describes forming a floating gate structure.

SUMMARY OF THE INVENTION

An object of this invention is to improve the erase speed of a split-gate EPROM, flash memory device.

Another object of this invention is to shrink the cell dimensions of a split-gate EPROM, flash memory device.

A method in accordance with this invention forms split gate electrode MOS FET devices. The method involves forming split gate electrode MOS FET devices including the following steps. Form a tunnel oxide layer over a semiconductor substrate; form a first doped polysilicon layer over the tunnel oxide layer followed by development of a native oxide layer upon the surface of the first doped polysilicon layer, the first doped polysilicon layer having an upper surface. Then, form a silicon nitride layer over the first doped polysilicon layer. Form a photoresist mask with a floating gate pattern to provide a cell defining mask over the silicon nitride layer. Etch through the photoresist mask to pattern the silicon nitride layer into the pattern of the floating gate. Remove the photoresist. Etch to remove the native oxide layer from the surface of the exposed first doped polysilicon layer. Form a polysilicon oxide (polyoxide) masking cap over the upper surface of the first doped polysilicon layer with the masking cap having narrow encroachment wings on its lateral portions. Pattern a gate electrode stack formed by the tunnel oxide layer and the first doped polysilicon layer in the pattern of the masking cap with a sharp bird's beak peak on the periphery of the upper surface of the first doped polysilicon layer. Form inter-polysilicon dielectric and control gate layers over the substrate covering the stack; and pattern the inter-polysilicon dielectric and control gate layers into adjacent mirror image split gate electrode pairs. Preferably, form FOX regions and then form active regions in the substrate prior to forming the tunnel oxide layer; form a silicon nitride floating gate mask over the first doped polysilicon layer; etch the tunnel oxide layer and the first doped polysilicon layer using the cap as a mask to form the floating gate electrode; and the bird's beak has a width from about 1,500 Å to about 2,000 Å a distance of 1,200 Å below the peak, and the angle of the wall of the floating gate proximate to the peak where the floating gate faces the polyoxide cap is from about 40° to about 50°.

Alternatively, the native oxide layer is removed from the first doped polysilicon layer by an etching process prior to forming the silicon nitride layer over the first doped polysilicon layer, and the bird's beak has a width of about 700 Å at a distance of 1,200 Å below the peak, and the angle of the wall of the floating gate proximate to the peak where the floating gate faces the polyoxide cap is from about 5° to about 15°.

Subsequently, source regions are formed self-aligned with the gate electrode stack by ion implantation while the future drain region sites are covered with a mask. Then sidewall spacers are formed and the source/drain regions are doped with a greater dopant level resulting in the source regions as compared with the drain regions.

In this embodiment of the invention the native oxide is removed before forming the silicon nitride over the first doped polysilicon layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
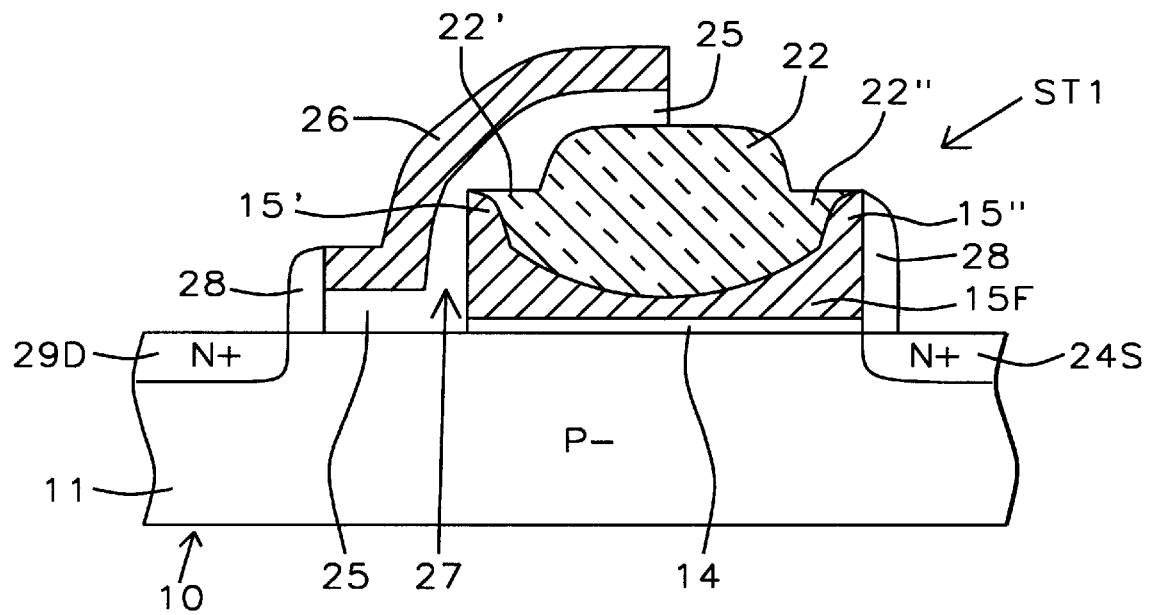
FIG. 1 shows a sectional view of a split-gate, EPROM, flash memory device having a floating gate electrode with blunt, wide polysilicon peaks and on the bird's beaks on the upper edges thereof.

FIG. 1 shows a sectional view of a split-gate, EPROM, flash memory device 10 having a floating gate electrode 15F with a blunt, wide polysilicon peaks 15' and 15" on the bird's beaks on the upper edges thereof. The device 10 is formed of a P- doped silicon substrate 11 upon which a tunnel oxide layer 14 has been formed. The floating gate electrode 15F is formed over tunnel oxide layer 14.

A polysilicon oxide (polyoxide) cap 22 (in the form of a dielectric block) with a central solid, dielectric dome (having a generally elliptical cross section (reaching down into the polysilicon floating gate electrode 15F) has a thickness from about 1400 Å to about 1900 Å is formed over the top of the floating gate electrode 15F.

The cap 22 has a high degree of encroachment in the form of wide wings 22' and 22" extending on either side (to the left and right) of the dome of cap 22.

The cap 22, the floating gate electrode 15F, and the tunnel oxide layer 14 are formed into a floating gate electrode stack ST1.

An Inter-Polysilicon Dielectric (IPD) layer 25 and a control gate electrode 26 are formed over the left side of floating gate electrode stack ST1. IPD layer 25 covers those portions of device 10 with a thickness of a dielectric from about 150 Å to about 300 Å composed preferably of an ONO (silicon Oxide/silicon Nitride/silicon Oxide) dielectric layer. Control gate electrode 26 comprises a second doped polysilicon layer 26 with a thickness within a range from about 1,500 Å to about 2,500 Å.

Top edges of the floating gate electrode 15F are shaped as bird's beaks 15' and 15". The angle of the inner walls of the bird's beaks 15' and 15" which are covered by the polysilicon cap 22 is from about 40° to about 50°.

The cap 22 has a width of the body thereof of about 4000 Å plus a high degree of encroachment in the form of wide wings 22' and 22" on either side of the 4000 Å wide body of cap 22. The wings 22' and 22" have a width of about 1,200 Å at a depth of about 1,200 Å below the peaks of bird's beaks 15' and 15" of floating gate electrode 15F.

Figure 2:
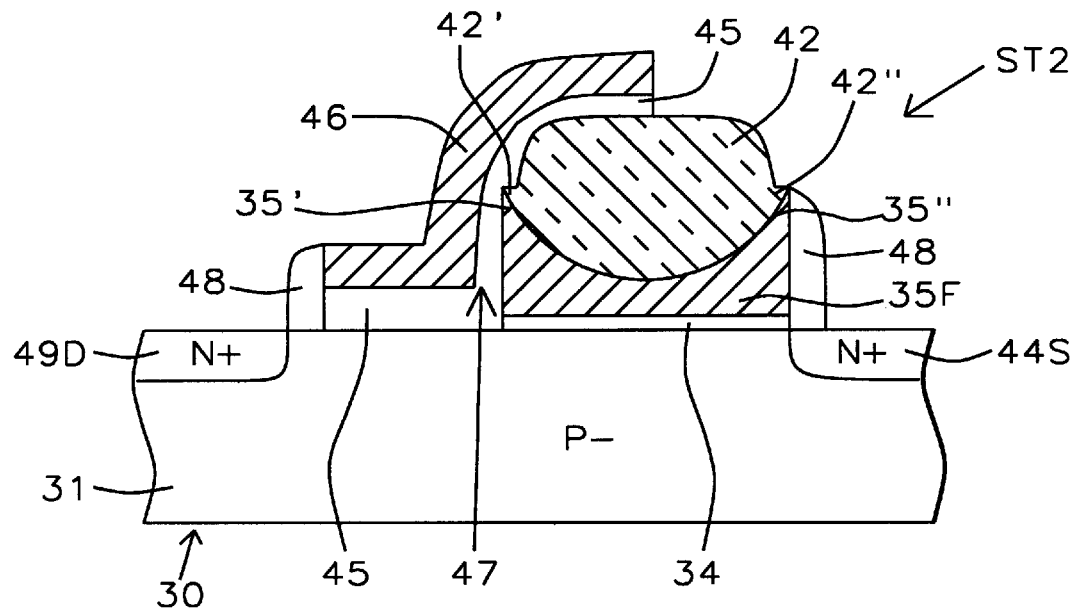
FIG. 2 shows a sectional view of a split-gate, EPROM, flash memory device which is a modified version of the device of FIG. 1 having a floating gate electrode with a set of sharp, narrow polysilicon peaks and on the bird's beaks on the upper edges thereof.

The above structure comprises an improved memory device, but it has the problem that the blunt, wide polysilicon peaks 15' and 15" on the bird's beaks on the upper edges of the floating gate electrode 15F cause the erase speed to be relatively slow as contrasted with the configuration of the floating gate electrode 35F shown in the improved embodiment of this invention shown in FIG. 2.

Spacers 28 are formed on the right sidewall of floating gate electrode 15F on the right and on the left sidewall of the control gate electrode 26 and the IPD layer 25.

Source region 24S, formed in substrate 11 and self-aligned with the floating gate electrode 15F, extends under a sidewall spacer 28 on the right. Drain region 29D, formed in substrate 11, is self-aligned with sidewall spacer 28 and formed adjacent to the control gate electrode 26.

FIG. 2 shows a sectional view of a split-gate, EPROM, flash memory device 30 which is a modified version of the device 10 of FIG. 1. Device 30 has a floating gate electrode 35F with sharp polysilicon peaks 35', 35" on the bird's beaks on the upper edges of electrode 35F. The device 30 is formed of a P- doped silicon substrate 31 upon which a tunnel oxide layer 34 has been formed. The floating gate electrode 35F is formed over tunnel oxide layer 34.

A polysilicon oxide cap 42 (in the form of a dielectric block) with a central solid, dielectric dome has a generally elliptical cross section and reaches down into the polysilicon floating gate electrode 35F, with a thickness from about 1,400 Å to about 1,900 Å. Cap 42 is formed over the top of the floating gate electrode 35F and has a very slight degree of encroachment in the form of narrow wings 42' and 42" extending on either side of the dome of cap 42. The cap 42, the floating gate electrode 35F, and the tunnel oxide layer 34 have been formed into a gate electrode stack ST2.

An IPD layer 45 and a control gate electrode 46 are formed over the left side of floating gate electrode stack ST2, IDP layer 45 and the left spacer 47. IPD layer 45 covers those portions of device 30 with a thickness of a dielectric from about 150 Å to about 300 Å composed preferably of an ONO dielectric layer.

Control gate electrode 46 comprises a second doped polysilicon layer 46 with a thickness within a range from about 1,500 Å to about 2,500 Å. The overall device 30 comprises a split-gate EPROM flash memory device.

Referring to the top edges of the floating gate electrode 35F which are in the shape of bird's beaks 35' and 35", the angle of the inner walls of the bird's beaks 35' and 35" which are covered by the polysilicon cap 22 is from about 5° to about 15°.

The cap 42 has a width of the body thereof of about 4000 Å plus a very slight degree of encroachment in the form of narrow wings 42' and 42" on either side of cap 22. The wings 42' and 42" have a width of about 700 Å at a depth of about 1,200 Å below the peaks of bird's beaks 35' and 35" of floating gate electrode 35F.

The structure of FIG. 2, as described above, comprises a significant improvement over the memory device of FIG. 1 in that it has narrow polysilicon peaks 35' and 35" on the bird's beaks on the upper edges of the floating gate electrode 35F which enhance the erase speed to provide an improved erase speed, as contrasted with the configuration of the floating gate electrode 15F shown in the embodiment of this invention shown in FIG. 1.

In addition, as compared with the floating gate electrode 15F of FIG. 1, the width of floating gate electrode 35F of FIG. 2 can be narrower because of the narrow wings 22', 22" of the polysilicon oxide cap 22, as well as the sharp bird's beaks 35', 35" of the floating gate electrode 35F. This means that the cell dimensions of the device of FIG. 2 are shrunken in contrast to the design seen in FIG. 1 by the shrinking of the wings 42' and 42" as contrasted with the wings 22' and 22" of FIG. 1.

Spacers 48 are formed on the right on the sidewall of the floating gate electrode 35F on the right side of device 30 and on the left sidewall of the control gate electrode 46 and the IPD layer 45.

Source region 44S, formed in substrate 31 self-aligned with floating gate electrode 35F, extends under a sidewall spacer 48 on the right; and drain region 49D is formed in substrate 31 self-aligned with a sidewall spacer 48 which is formed adjacent to the control gate electrode 46.

FIGS. 3A–3K show the steps of forming the device of FIG. 1 in accordance with one embodiment of this invention.

Figure 3A:
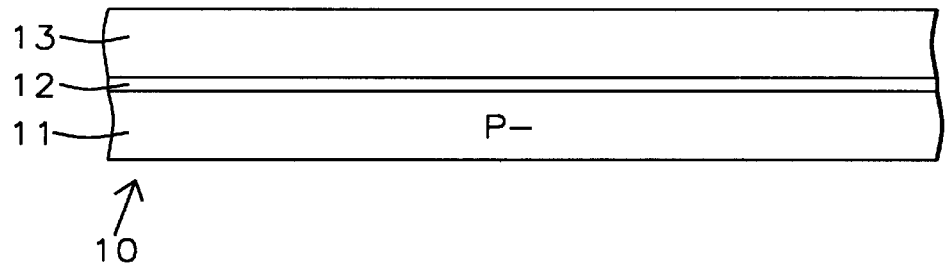
FIGS. 3A–3K show the steps of forming the device of FIG. 1 in accordance with one embodiment of this invention.
Figure 3B:
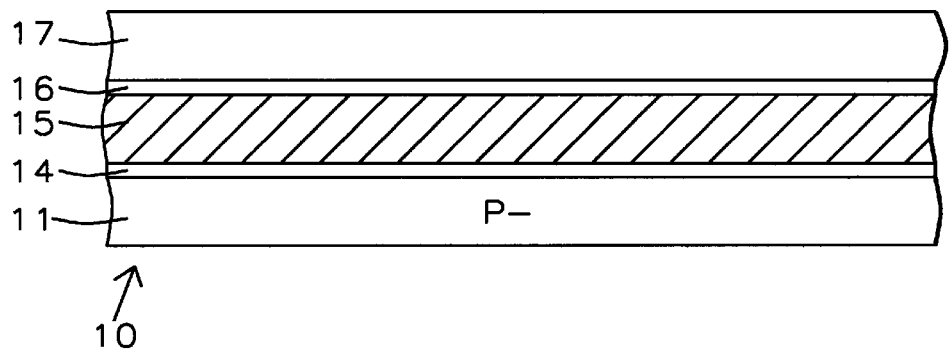
Figure 3C:
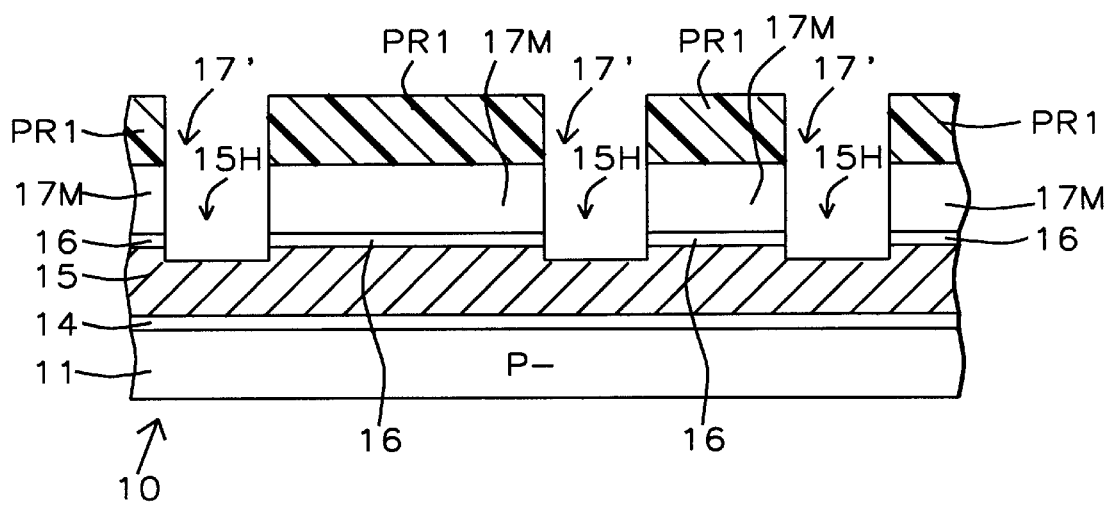
Figure 3D:
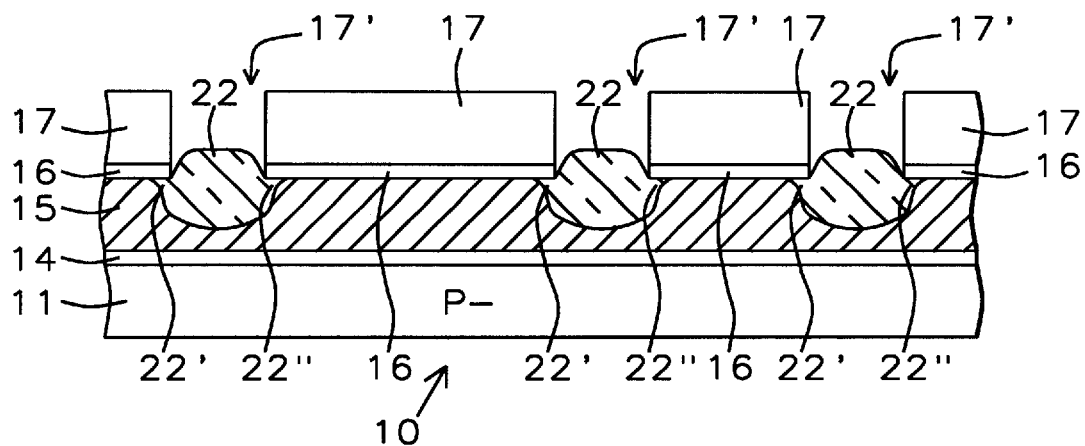
Figure 3E:
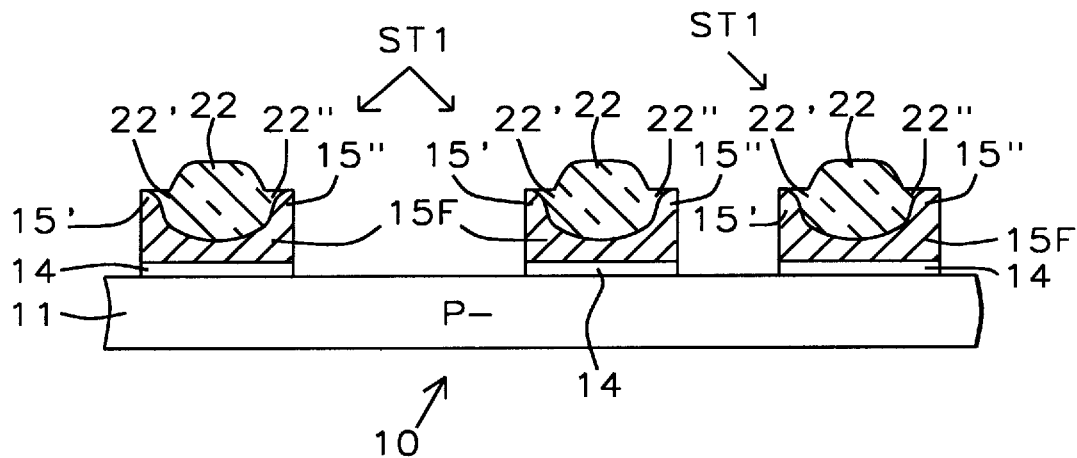
Figure 3F:
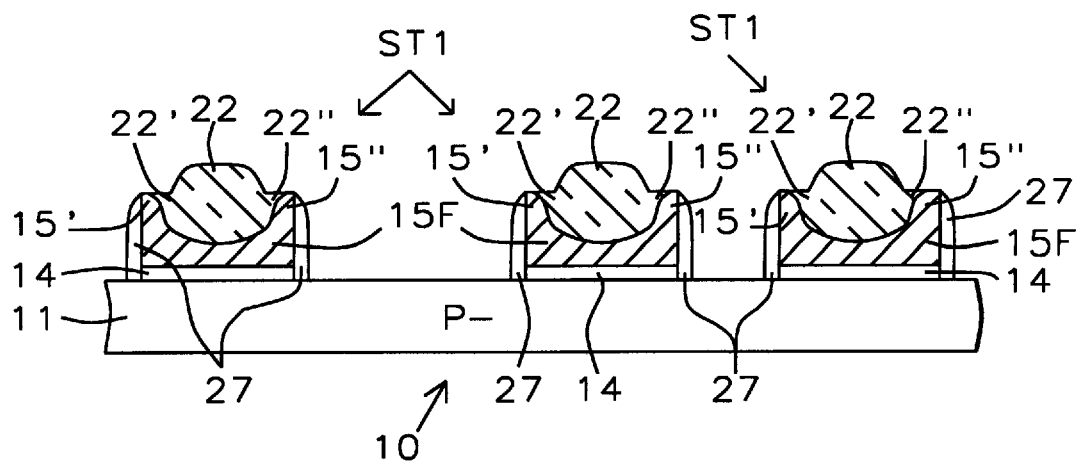
Figure 3G:
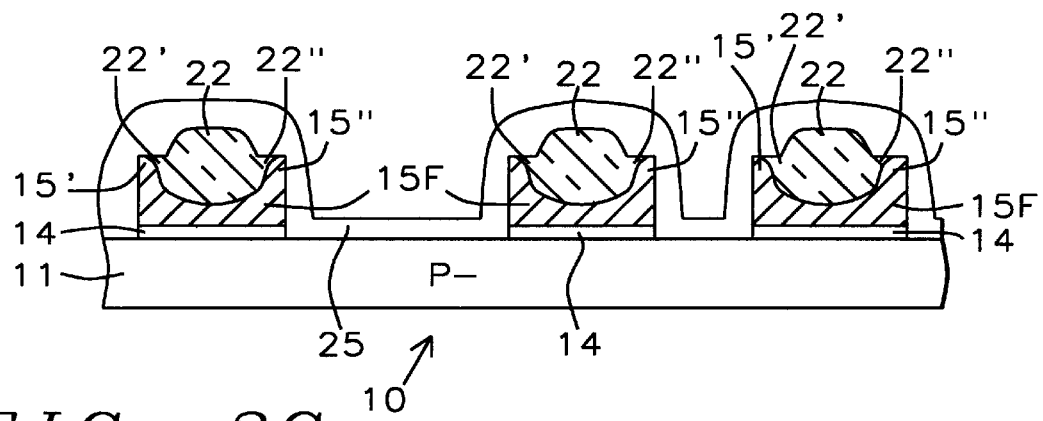
Figure 3H:
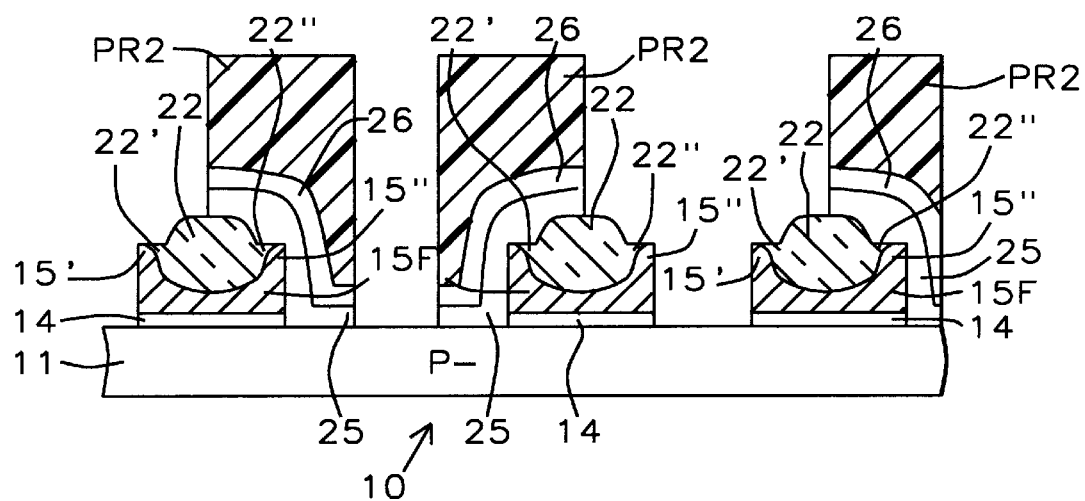
Figure 3I:
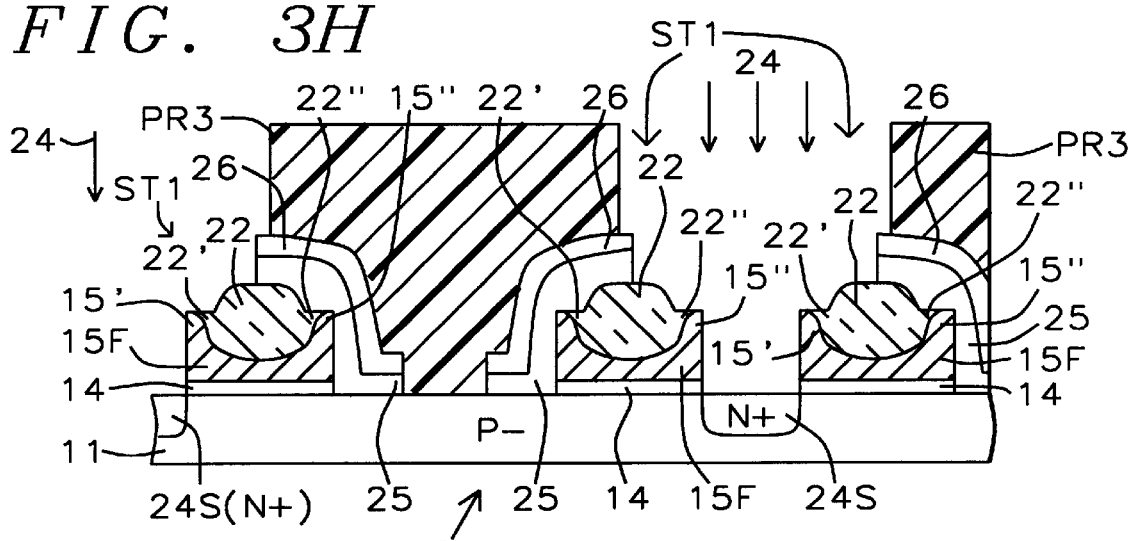
Figure 3J:
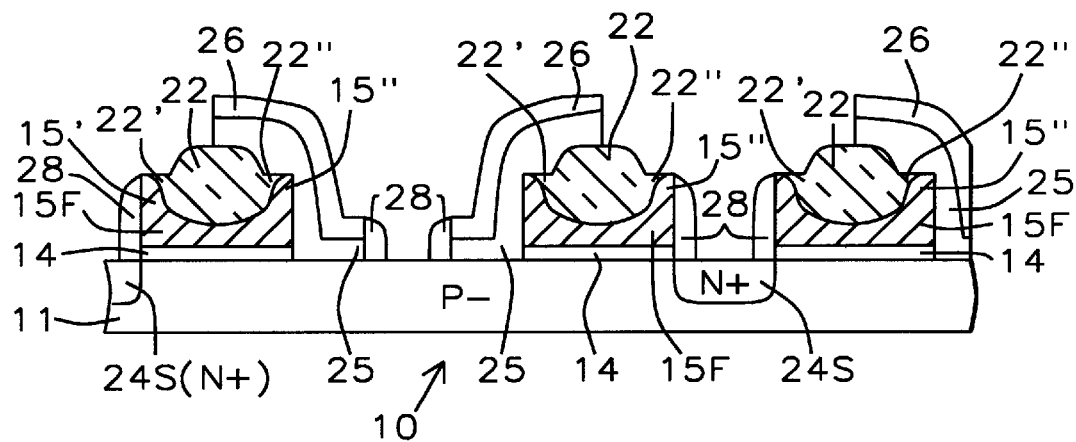
Figure 3K:
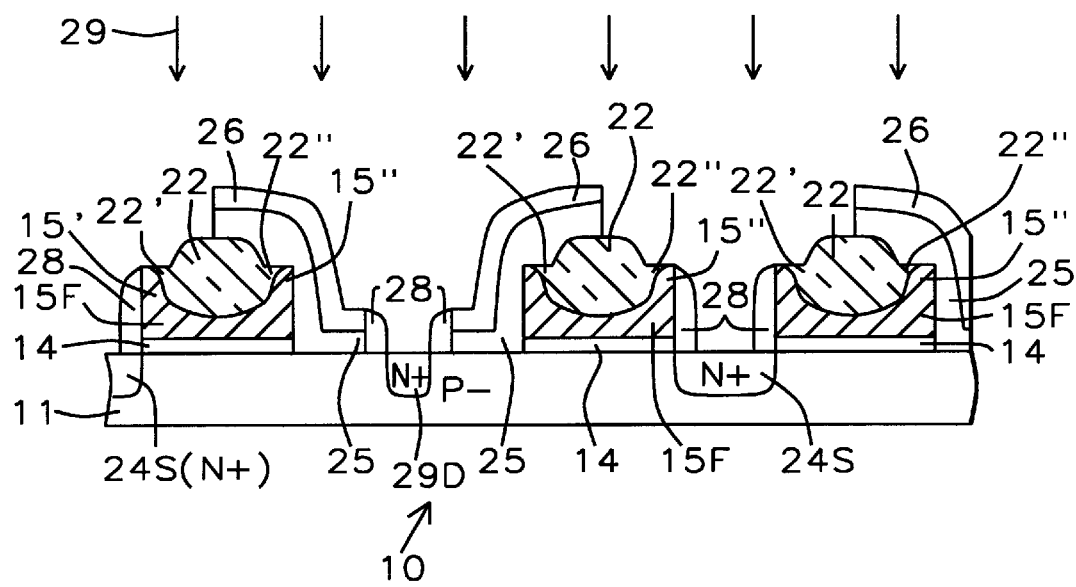
Figure 4A:
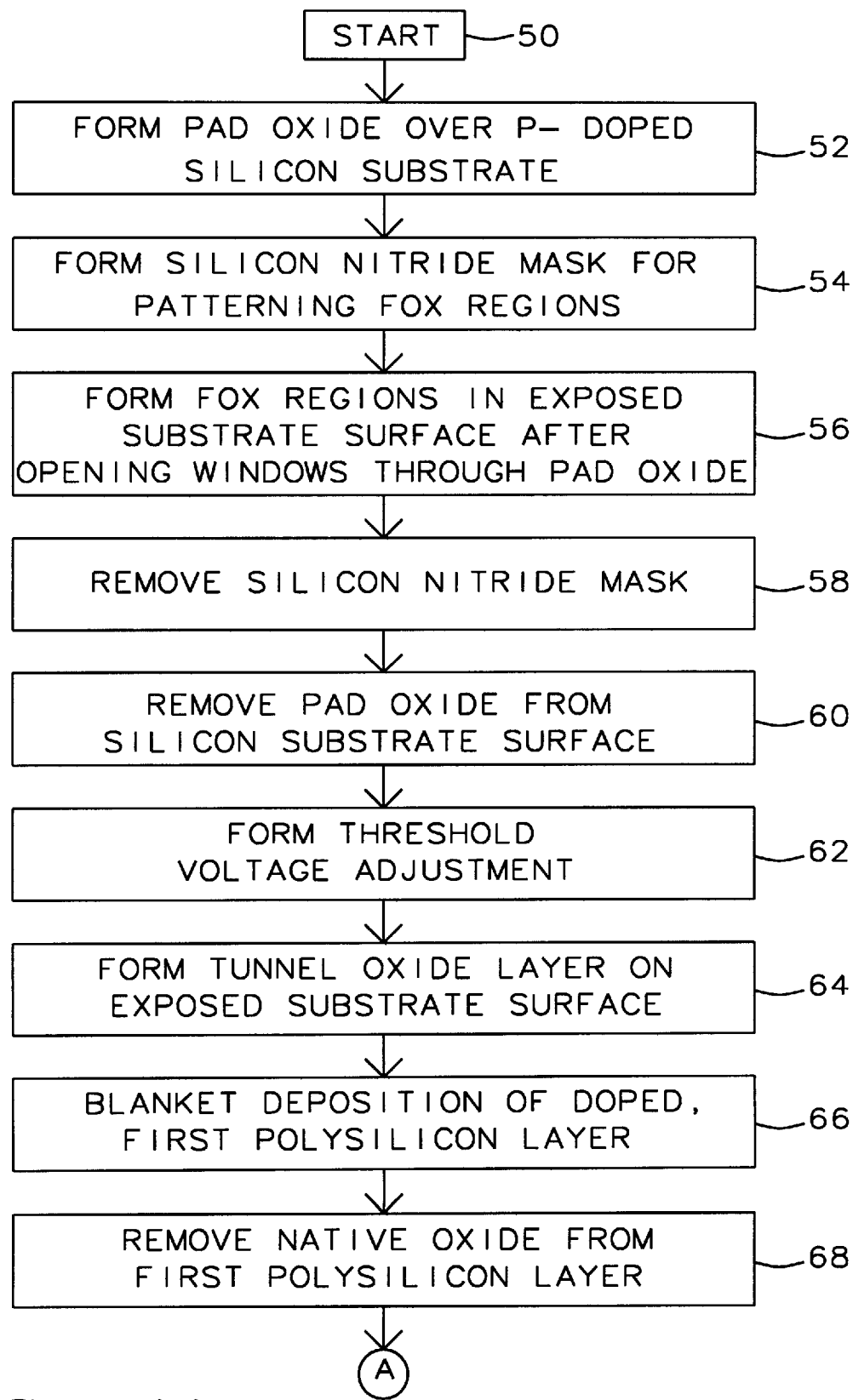
FIGS. 4A, 4B and 4C show a flow chart of two embodiments of methods in accordance with this invention shown in FIGS. 3A–3K and FIGS. 5A–5K.
Figure 4B:
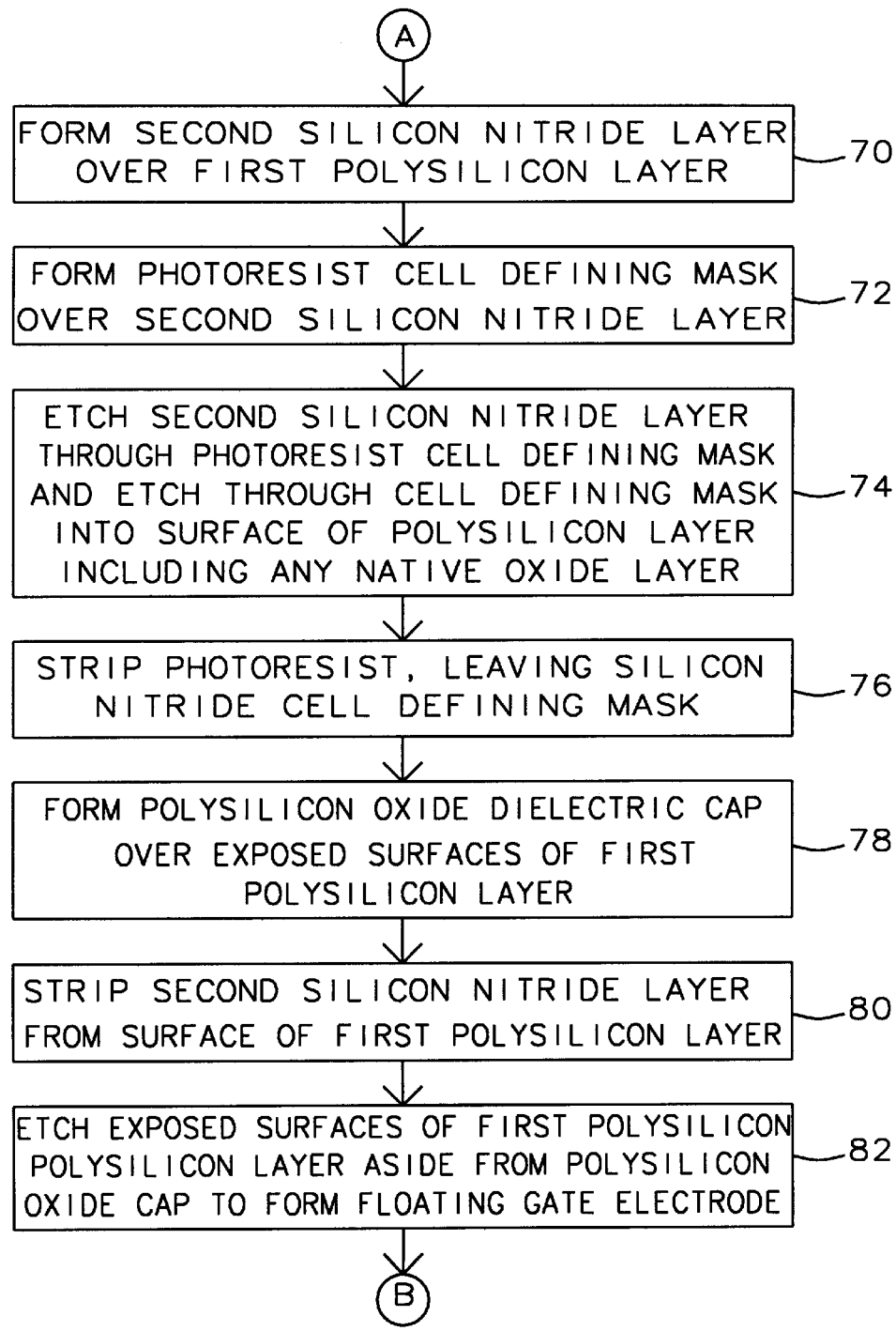
Figure 4C:
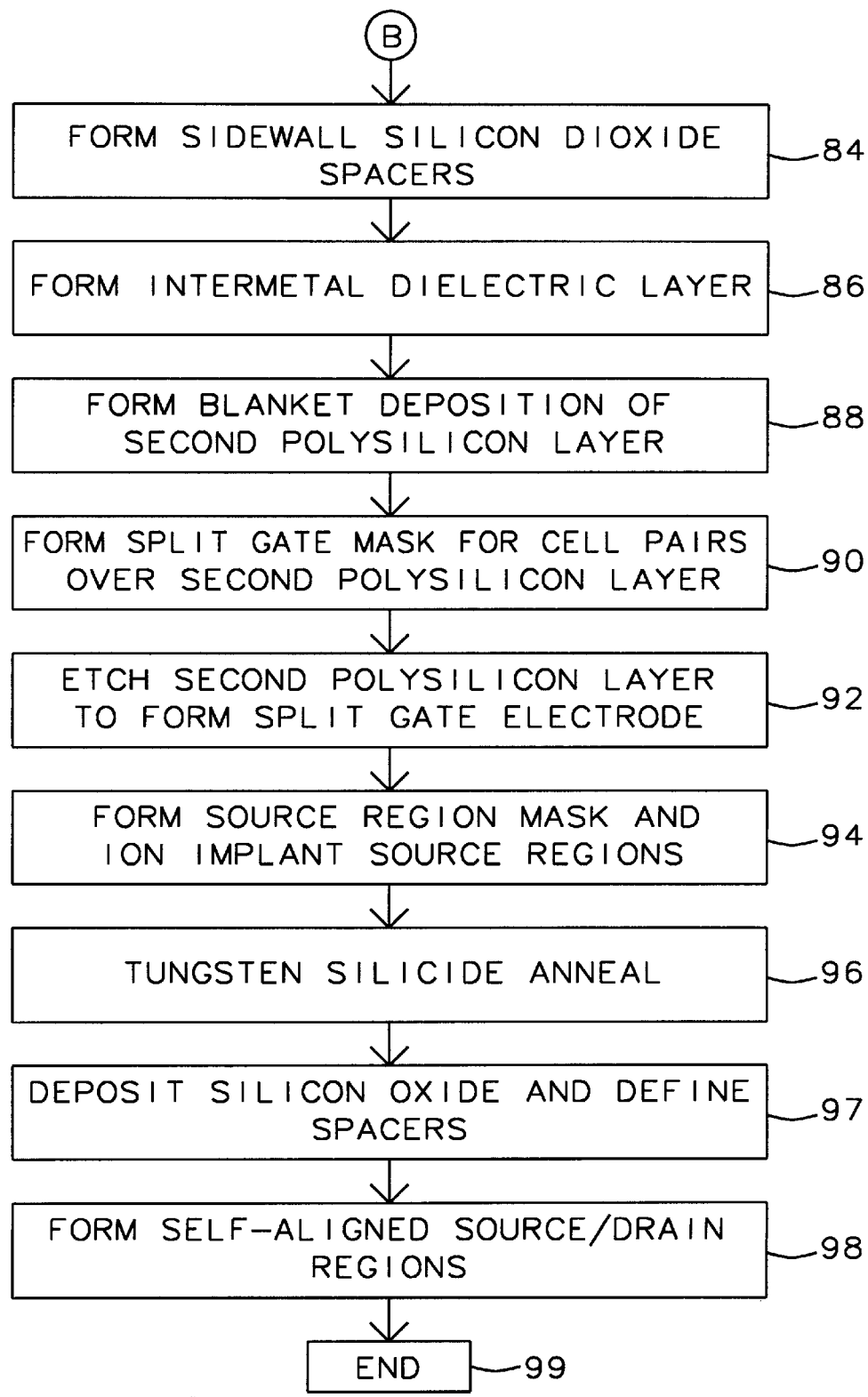

FIGS. 4A, 4B and 4C show a flow chart of two embodiments of methods in accordance with this invention shown in FIGS. 3A–3K and FIGS. 5A–5I. Referring to FIG. 4A, a flow chart is shown of the process of manufacture of a device 10 shown in FIG. 1. The process begins with block 50.

The first step in forming a device 10 in accordance with the method of this invention is illustrated in FIG. 3A and described in block 52 in FIG. 4A. In block 52, manufacture of a device 10 begins with deposition of a pad oxide layer 12 over a P- doped silicon substrate 11.

Referring to FIG. 3A, in block 54 in FIG. 4A a silicon nitride mask 13 is formed over pad oxide layer 12. Mask 13 has windows (not shown) for patterning the device to form field oxide (FOX) regions on other portions of the device (as will be well understood by those skilled in the art).

In block 56, FOX regions (not shown) are formed in the exposed surface of substrate 11 after opening windows through the pad oxide layer 12, (not shown but as will be well understood by those skilled in the art).

Referring to FIG. 3B, in block 58, the next step is to remove the FOX patterning silicon nitride mask 13.

In block 56, the remainder of pad oxide layer 12 is removed from the surface of silicon substrate 11.

Then as described in block 62 a threshold voltage $V_T$ adjustment is performed (as will be well understood by those skilled in the art) ion implanting $V_T$ dopant into the active area, by doping the exposed regions of the substrate 11, aside from the FOX regions.

The next step, described in block 66 in FIG. 4A, is deposition of a blanket tunnel oxide layer 14, as seen in FIG. 3B on the exposed surface of substrate 11 aside from the FOX regions and as described in block 64 in FIG. 4A. Subsequently, there is a step of blanket deposition of a doped, first doped polysilicon (floating gate electrode) layer 15 from about 1,400 Å to about 1,900 Å thick over the tunnel oxide layer 14 (as well as the FOX regions). The process employed to deposit the doped polysilicon layer 15 results in the formation of a native oxide layer 16 having a thickness from about 50 Å to about 150 Å because of the presence of residual oxygen in the processing chamber.

In accordance with the embodiment of the invention in FIGS. 3A–3K, the flow chart skips block 68 leaving the native oxide layer 16 in place, as contrasted with the embodiment of the invention of FIGS. 5A–5K wherein the step described in block 68 is employed to overcome the problem of bird's beak caused by the native oxide layer 16. Leaving the native oxide layer 16 in place requires fewer processing steps, but there is the disadvantage of encroachment which is overcome by the embodiment of the invention of FIGS. 5A–5K. The next step is to form a second silicon nitride layer 17 formed over first polysilicon layer 15, as seen in FIG. 3B and as described in block 70 in FIG. 4B.

Then, as described in block 72 referring to FIG. 3C, form over second silicon nitride layer 17 a cell defining, photoresist mask PR1 with windows 17' therethrough down to the surface of silicon nitride layer 17.

Then, as described in block 74, the second silicon nitride layer 17 is patterned into a cell defining mask 17M by forming windows 17' therethrough by a conventional subtractive process such as etching with buffered hydrogen fluoride (HF) solution. Windows 17' are formed by etching through windows in cell mask PR1, as seen in FIG. 3C. Below the windows 17', any exposed portion of native oxide layer 16 is etched away from the surface of first doped polysilicon layer 15 leaving slight depressions 15H in the surface of first polysilicon layer 15. The native oxide layer 16 is etched away through windows 17' with the buffered hydrogen fluoride solution (HF) and the etching continues down into the surface of and first doped polysilicon layer 15 through windows 17' in mask 17M to facilitate formation of silicon oxide caps 22.

After completion of the step of block 74, the next step is to strip the photoresist cell mask PR1 as described in block 76 in FIG. 4B leaving the silicon nitride layer 17 formed into a cell defining mask 17M with windows 17' therethrough above first polysilicon layer 15.

Referring to FIG. 3D, as the result of a chemical oxidation reaction the exposed surface of the first polysilicon layer 15 at the bottom of windows 17' is reacted with oxygen to form polysilicon oxide structures in the form of polysilicon oxide caps 22 (in the form of a dielectric) having a thickness of about 1500 Å, at the bottom of windows 17' in mask 17M, as seen in FIG. 3E and as described in block 78 in FIG. 4B. The resulting polysilicon oxide caps 22 have a high degree of encroachment in the form of wide wings 22' and 22" extending under the native oxide layer 16 on either side of windows 17' in mask 17M as described in some detail with reference to FIG. 1 above. The wings 22' and 22" have a width of from about 1,500 Å to about 2,000 Å at a depth of about 1,200 Å below the top surface of floating gate electrode 15F.

Next, as described in block 80 in FIG. 4B, the cell defining mask 17M (formed from the second silicon nitride layer) is stripped from the device 10 as shown in FIG. 3E leaving the surface of first doped polysilicon layer 15 exposed except where the caps 22 are formed.

Subsequently, polysilicon oxide caps 22 are used as floating gate electrode masks, as described in step 82 in FIG. 4B. The exposed surfaces of first polysilicon layer 15 aside from polysilicon oxide (polyoxide) caps 22 are etched in the form of caps 22 to form floating gate electrodes 15F in an array of floating gate electrode stacks ST1 on the surface of substrate 11. Three such floating gate electrode stacks ST1 are shown in FIG. 3E formed by tunnel oxide layer 14, floating gate electrodes 15F and caps 22.

Each floating gate electrode 15F, which is formed below its polysilicon oxide cap 22, has lateral blunt peaks of bird's beaks 15' and 15" formed under wide wings 22', 22". Top edges of the floating gate electrode 15F are in the shape of bird's beaks 15' and 15". The relatively wide angle between the inner wall of the bird's beaks 15', 15" and the sidewalls of electrodes 15F provide floating gate electrode peaks 15' and 15" have an angle of the wall of the floating gate electrode 15F at the top surface where it faces the polyoxide cap 22 is from about 40° to about 50°.

FIG. 4C shows the next portion of the flow chart continuing beyond the step shown in block 82.

Referring to block 84 and FIG. 3F, the next step is to form silicon dioxide sidewall spacers 27 adjacent to the sidewalls of floating gate electrode 15F by a process such as High Temperature Oxidation (HTO).

Referring to block 86 in FIG. 4C and FIG. 3G, the next step is to form IPD layer 25 as a blanket layer over device 10 composed preferably of ONO dielectric within a range from about 150 Å to about 300 Å thick.

Then as shown in FIG. 3H and described in block 88 in FIG. 4C, form a blanket deposit of a second doped polysilicon layer 26 to a thickness within a range from about 1,500 Å to about 2,500 Å over device 10.

Referring again to FIG. 3H, as described in block 90 in FIG. 4C, form a split gate mask PR2 for cell pairs over second polysilicon layer 26.

Then as described in block 92, etch the second polysilicon layer to form split gate electrodes 26. Then strip split gate mask PR2 from device 10.

Referring to block 94 in FIG. 4C and to FIG. 3I, a source region mask PR3 mask is formed over the split gate electrodes 26. Then a N+ doped source regions 24S is formed between and self-aligned with the adjacent pair of stacks ST1 on the right side of device 10. A second N+ doped source regions 24S is formed self-aligned with the stack ST1 on the far left side of FIG. 3I by ion implanting dopant ions 24 through the openings in mask PR3. Regions 24S are formed in substrate 11, aside from floating gate electrode 15F. Then strip mask PR3 from device 10.

Next, in block 96 a tungsten silicide ($WSi_x$) anneal is performed.

In block 97, a blanket silicon oxide spacer layer is deposited over device 10 and etched back to form spacers 28 as shown in FIG. 3J on the surface of substrate 11 and adjacent to the sidewalls of the floating gate electrodes 35F of stacks ST1 and control gate electrodes 26.

In block 98 self-aligned drain regions 29 are formed between the lower ends of the split gate control gate electrodes 26 and spacers 28. Additional N type dopant is implanted into source regions 24S between spacers 28 adjacent to stacks ST1 with the result that the source regions are more heavily doped than the drain regions.

In block 99, the process ends.

In summary referring to FIGS. 3A–3K, a simple method of cell fabrication is to perform the following steps:

1) tunnel oxide deposition,
2) first polysilicon deposition,
3) silicon nitride deposition directly after the polysilicon deposition step, so the native oxide remains on the surface of polysilicon.
4) Floating gate electrode definition by etching of the first polysilicon layer and the silicon nitride layer and forming of a polysilicon oxide cap by oxidation.

The result is a floating gate electrode wherein it is not easy to control the dimensions of the polysilicon peak of the floating gate (bird's beak of polysilicon) because of the effects caused by encroachment, which results in an insufficiently sharp peak of the polysilicon after the polysilicon etching process using the polysilicon oxide cap as a mask. The erase speeds are affected because of the variation of the sharpness of the polysilicon peak.

FIGS. 5A–5K show the steps of forming the device of FIG. 1 in accordance with one embodiment of this invention.

As stated above, the flow chart of FIGS. 4A, 4B and 4C also shows the process flow of the embodiments of a method in accordance with this invention shown in FIGS. 5A–5K.

Referring to FIG. 4A, a flow chart is shown of the process of manufacture of a device 30 shown in FIG. 2. The process begins with block 50.

Figure 5A:
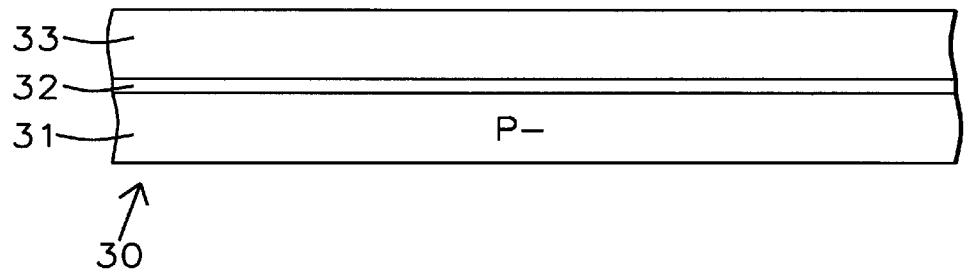
FIGS. 5A–5K show steps of forming the device of FIG. 2 in accordance with another embodiment of this invention.

The first step in forming a device 30 in accordance with the method of this invention is illustrated in FIG. 5A and described in block 52 in FIG. 4A. In block 52, manufacture of a device 30 begins with deposition of a pad oxide layer 32 over a P- doped silicon substrate 31.

Referring to FIG. 5A, in block 54 in FIG. 4A a silicon nitride mask 33 is formed over pad oxide layer 32. Mask 33 has windows (not shown) for patterning the device to form field oxide (FOX) regions on other portions of the device (as will be well understood by those skilled in the art).

In block 56, FOX regions (not shown) are formed in the exposed surface of substrate 31 after opening windows through the pad oxide layer 32, (not shown but as will be well understood by those skilled in the art).

Figure 5B:
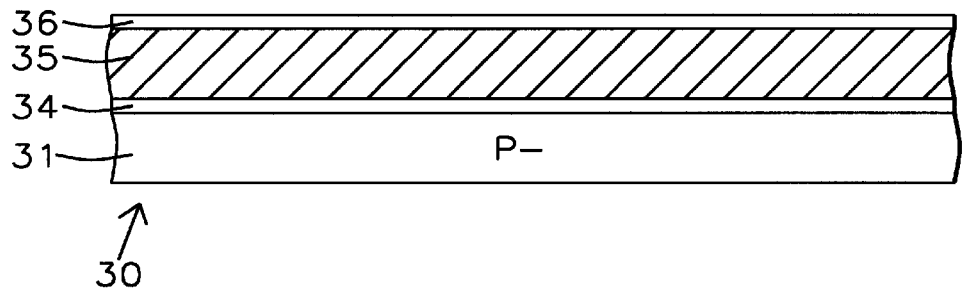

Referring to FIG. 5B, in block 58, the next step is to remove the FOX patterning silicon nitride mask 33.

In block 60, the remainder of pad oxide layer 32 is removed from the surface of silicon substrate 31.

Then as described in block 62 a threshold voltage $V_T$ adjustment is performed (as will be well understood by those skilled in the art) ion implanting $V_T$ dopant into the active area, by doping the exposed regions of the substrate 31, aside from the FOX regions.

As described in block 66 in FIG. 4A, the next step is to deposit a blanket tunnel oxide layer 34, seen in FIG. 5B on the exposed surface of substrate 31 aside from the FOX regions and as described in block 64 in FIG. 4A. Next, there is a step of blanket deposition of a first, doped polysilicon (floating gate electrode) layer 35 from about 1,400 Å to about 1,900 Å thick over the tunnel oxide layer 34 (as well as the FOX regions). The polysilicon deposition results in the formation of a native oxide layer 36 on the surface of doped polysilicon layer 35. The native oxide from about 50 Å to about 150 Å thick because of the presence of residual oxygen in the processing chamber.

In accordance with the embodiment of the invention in FIGS. 5A–5K, the flow chart advances to block 68, which describes the step of removing the native oxide layer 36 on the surface of doped polysilicon layer 35. The etching step described in block 68 is employed using hydrogen fluoride (HF) etchant to overcome the problem of bird's beak caused by the native oxide layer 36. Leaving the native oxide layer 16 in place as in FIGS. 3A–3K required fewer processing steps, but there was the disadvantage of greater encroachment caused by the native oxide. This problem is overcome by the embodiment of the invention of FIGS. 5A–5K.

Figure 5C:
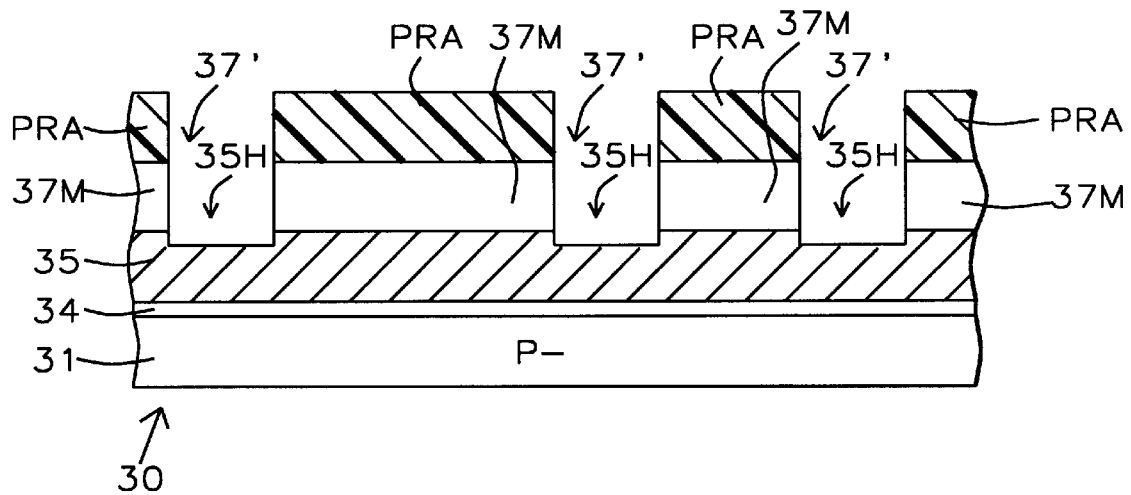

The next step described in block 70 in FIG. 4B is to form a second silicon nitride layer 37 formed over first polysilicon layer 35, as seen in FIG. 5C. Then, as described in block 72 referring again to FIG. 5C, form over second silicon nitride layer 37 a cell defining, photoresist mask PRA with windows 37' therethrough down to the surface of silicon nitride layer 37 as seen in FIG. 5C.

Then, and as described in block 74 the second silicon nitride layer 37 is patterned into a cell defining mask 37M by forming windows 37' therethrough by a conventional subtractive process with buffered hydrogen fluoride (HF) solution. Windows 37' are formed by etching with hydrogen fluoride solution (HF) through windows in cell mask PRA, as seen in FIG. 5C. At this stage, slight depressions 35H in the surface of first polysilicon layer 35 are etched through the windows 37' with the buffered hydrogen fluoride solution (HF) which etches into the surface of polysilicon layer 35 through windows 37' in mask 37M.

After completion of the step of block 74, the next step is to strip the photoresist cell mask PRA as described in block 76 in FIG. 4B leaving the silicon nitride layer 37 which has been formed into a cell defining mask 37M with windows 37' therethrough above first polysilicon layer 35.

Figure 5D:
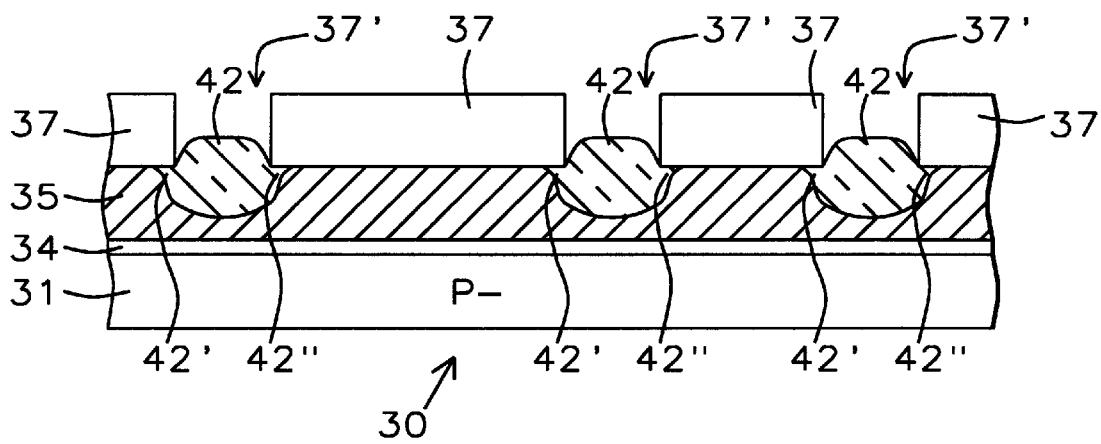
Figure 5E:
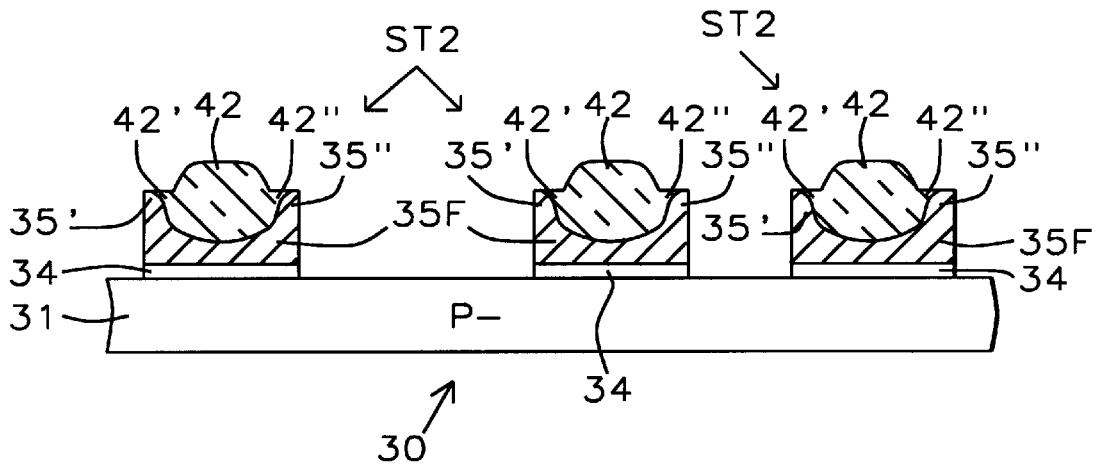

Referring to FIG. 5D, as the result of a chemical oxidation reaction the exposed surface of the first polysilicon layer 35 at the bottom of windows 37' is reacted with oxygen to form polysilicon oxide structures in the form of polysilicon oxide caps 42 (in the form of a dielectric) having a thickness of about 1500 Å, at the bottom of windows 37' in mask 37M, as seen in FIG. 5E and as described in block 78 in FIG. 4B.

The resulting polysilicon oxide caps 42 have a slight degree of encroachment in the form of narrow wings 42' and 42" extending under the native oxide layer 36 on either side of windows 37' in mask 37M as described in some detail with reference to FIG. 2 above. The wings 42' and 42" have a width of from about 700 Å at a depth of about 1,200 Å below the top surface of floating gate electrode 35F.

Next, as described in block 80 in FIG. 4B, the cell defining mask 37M (formed from the second silicon nitride layer) is stripped from the device 30 as shown in FIG. 5E leaving the surface of polysilicon layer 35 exposed except where the caps 42 are formed.

Then, polysilicon oxide caps 42 are used as a set of floating gate electrode masks, as described in step 82 in FIG. 4C. The exposed surfaces of first polysilicon layer 35 aside from polysilicon oxide (polyoxide) caps 42 are etched to form floating gate electrodes 35F in an array of floating gate electrode stacks ST2 on the surface of substrate 31 in the shape of caps 42. Three such floating gate electrode stacks ST2 are shown in FIG. 5E formed by tunnel oxide layer 34, floating gate electrodes 35F and caps 42.

Each of the floating gate electrodes 35F, which is formed below its polysilicon oxide cap 42, has a pair of blunt peaks of bird's beaks 35' and 35" formed under the wide wings 42' and 42". The top edges of the floating gate electrode 35F are in the shape of bird's beaks 35' and 35". The relatively wide angle between the inner wall of the bird's beaks 35' and 35" and the sidewalls of electrodes 35F provide floating gate electrode peaks 35' and 35" have an angle of the wall of the floating gate electrode 35F at the top surface where it faces the polyoxide cap 42 is from about 5° to about 15°.

FIG. 4C shows the next portion of the flow chart continuing beyond the step shown in block 82.

Figure 5F:
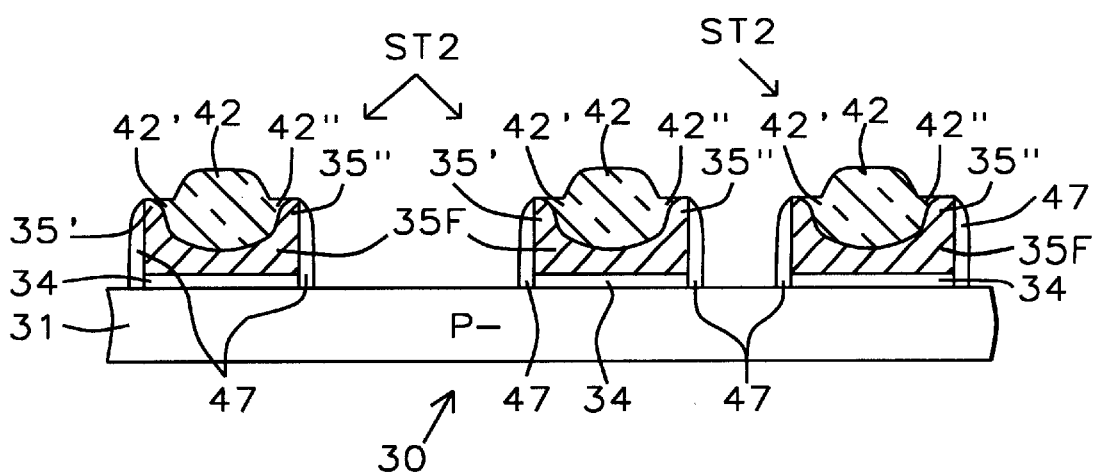

Referring to block 84 in FIG. 4C and FIG. 5F, the next step is to form silicon dioxide sidewall spacers 47 adjacent to the sidewalls of floating gate electrode 35F by a process such as HTO.

Figure 5G:
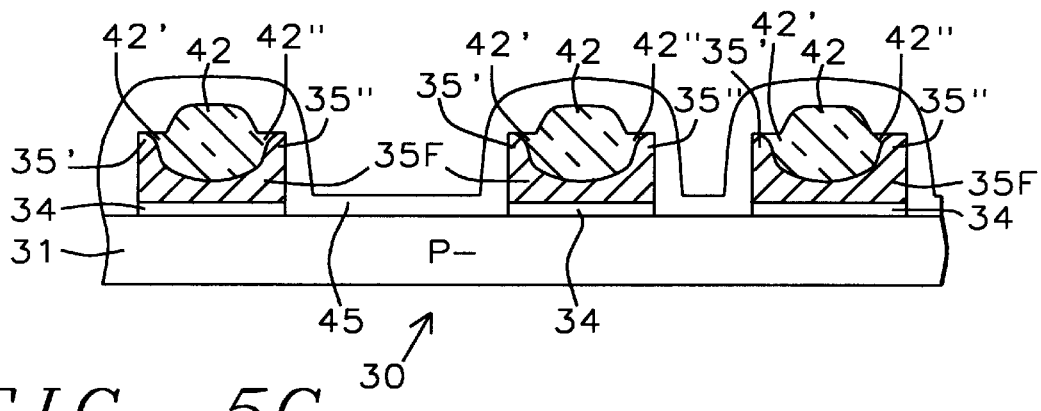

Referring to block 86 in FIG. 4C and FIG. 5G, the next step is to form as IPD layer 45 as a blanket layer over device 30 within a range from about 150 Å to about 300 Å thick composed preferably of ONO dielectric.

Figure 5H:
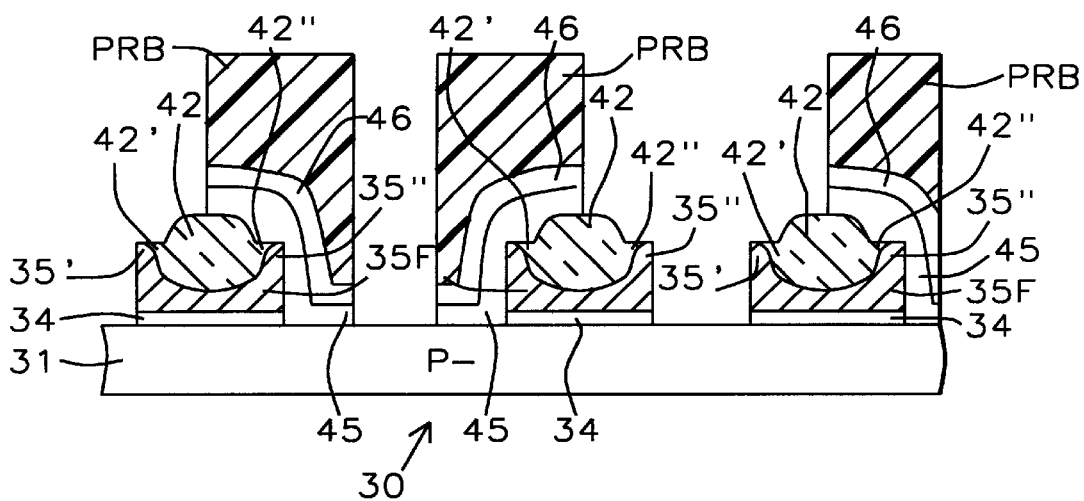

Then as shown in FIG. 5H and described in block 88 in FIG. 4C, form a blanket deposit of a second doped polysilicon layer 46 to a thickness within a range from about 1,500 Å to about 2,500 Å over device 30.

Referring again to FIG. 5H, as described in block 90 in FIG. 4C, form a split gate mask PRB for cell pairs over second polysilicon layer 46.

Then using mask PRB as the pattern, as described in block 92, etch the second polysilicon layer 46 to form split gate electrodes 46. Then strip mask PRB from device 30.

Figure 5I:
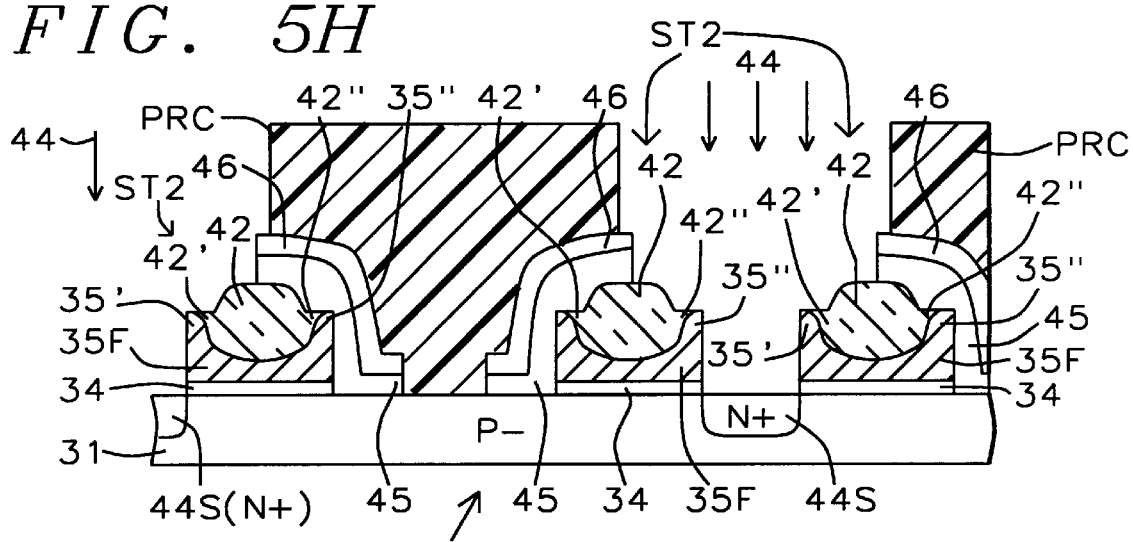

Referring to block 94 in FIG. 4C and to FIG. 5I, a source region mask PRC mask is formed over the split gate electrodes 46. Then N+ doped source regions 44S are formed between and self-aligned with the adjacent pair of floating gate stacks ST2 formed on the right side and the far left side of FIG. 5I by ion implanting dopant ions 44 through the openings in mask PRC. Regions 44S are formed in substrate 31, aside from floating gate electrode 35F. Then strip mask PRC from device 30.

In block 96 a tungsten silicide ($WSi_x$) anneal occurs.

Figure 5J:
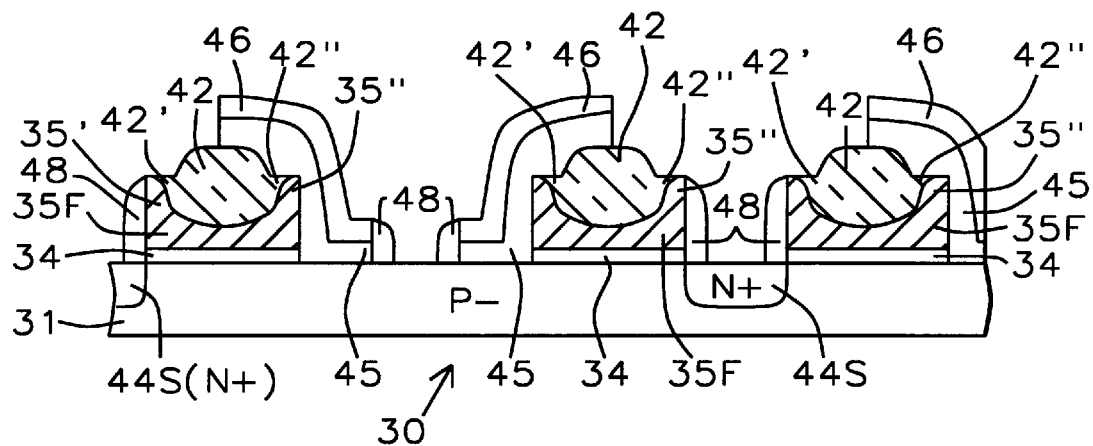
Figure 5K:
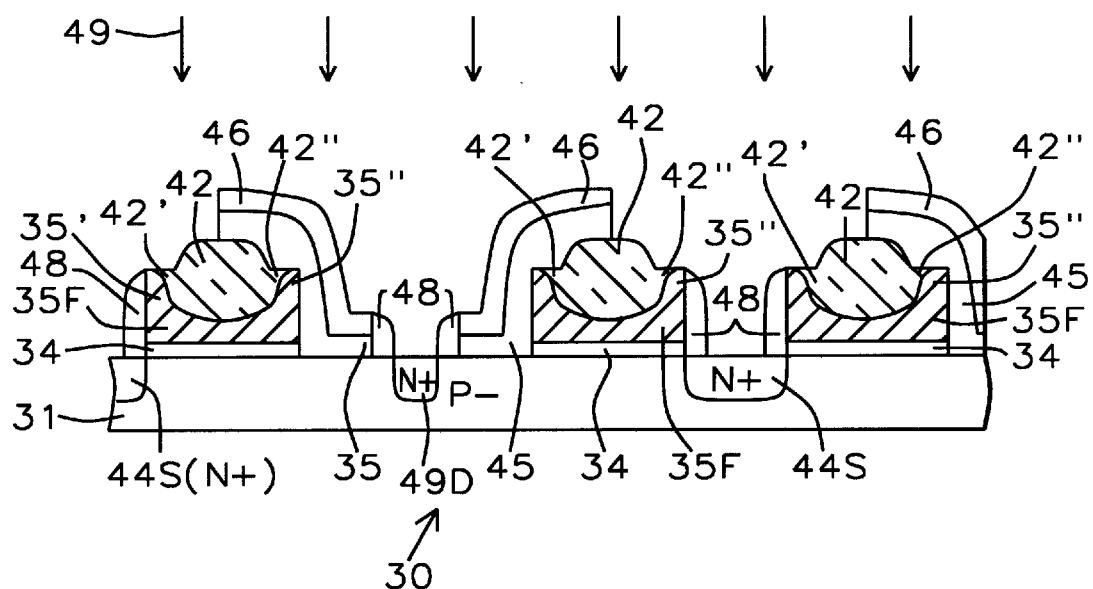

In block 97, a blanket silicon oxide spacer layer is deposited over device 30 and etched back to form spacers 48 as shown in FIG. 5J on the surface of substrate 11 and adjacent to the sidewalls of the floating gate electrodes 35F of stacks ST1 and control gate electrodes 26.

In block 98 self-aligned drain regions 49 are formed between the lower end of the split gate control gate electrodes 46 and spacers 48. Additional N type dopant is implanted between spacers 48 adjacent to stacks ST2 into source regions 44S with the result that the source regions 44S are more heavily doped that the drain regions 49D.

In block 99, the process ends.

In summary referring to FIGS. 5A–3K, a simple method of cell fabrication is to perform the following steps:

1) tunnel oxide deposition,
2) first polysilicon deposition,
3) removal of native oxide from the surface of the polysilicon layer,
4) silicon nitride deposition after removal of the native oxide from the polysilicon layer,
4) floating gate electrode definition by etching of the first polysilicon layer and the silicon nitride layer and forming of a polysilicon oxide cap by oxidation.

The result is a floating gate electrode in which the dimensions of the polysilicon peak of the floating gate (bird's beak of polysilicon) are easier to control because the effects of encroachment are minimized. The polysilicon etching process results in a sharp polysilicon peak, using the polysilicon oxide cap as a mask. The erase speeds are improved because of the sharpness of the polysilicon peak.

SUMMARY

This invention produces an improved memory device by a HF chemistry process which is employed before silicon nitride deposition. The native oxide on the surface of polysilicon is removed, which decreases the encroachment of polysilicon after the oxidation process. The result is a memory device with increased sharpness of polysilicon peak. In addition there is improved control of bird's beak of the polysilicon floating gate. A sharper peak of the polysilicon floating gate electrode is obtained after the polysilicon etching process, which improves the speed of erasing in split-gate flash memory devices.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of forming split gate electrode MOS FET devices including the steps in the sequence as follows:

form a tunnel oxide layer over a semiconductor substrate, form a doped first polysilicon layer, having an upper surface over said tunnel oxide layer, followed by development of a native oxide layer upon said upper surface of said first polysilicon layer, form a mask layer over said native oxide layer, form a cell-defining mask over said mask layer with a opening therethrough where a floating gate electrode stack is to be formed, etch through said opening in said cell-defining mask to form a window through said mask layer and said native oxide down to said upper surface of said first polysilicon layer, form a cap on said upper surface of said first polysilicon layer at the bottom of said window, strip said mask layer from said native oxide layer and said first polysilicon layer, remove portions of said tunnel oxide layer and said first polysilicon layer aside from said cap thereby forming a floating gate electrode stack with a bird's beak peak on the periphery of said upper surface of said first polysilicon layer, form an inter-polysilicon dielectric layer and a control gate layer over exposed portions of said substrate and covering said stack, pattern said inter-polysilicon dielectric layer and said control gate layer into a split gate electrode, form a source region self-aligned with said floating gate electrode stack, and a drain region self-aligned with said split gate electrode.

2. The method of claim 1 including the steps comprising:

oxidize said first polysilicon layer through said mask layer to form said cap of polysilicon oxide in and on said upper surface of said first polysilicon layer, and then pattern said tunnel oxide layer and said floating gate electrode stack in a subtractive process using said polysilicon oxide cap as a mask thereby removing material not protected by said polysilicon oxide cap.

3. The method of claim 1 including the steps comprising:

form said mask layer from silicon nitride, form said cap in and on said upper surface of said first polysilicon layer by forming a polysilicon oxide in and on said upper surface of said first polysilicon layer through said window, and pattern said tunnel oxide layer and said first polysilicon layer in a subtractive process removing material not protected by said cap.

4. The method of claim 1 including the steps comprising:

form said mask layer from silicon nitride, and after forming said window in said silicon nitride, then strip said cell defining mask, form said cap in and on said upper surface of said first polysilicon layer by forming a polysilicon oxide cap in and on said upper surface of said first polysilicon layer through said window, and pattern said tunnel oxide layer and said first polysilicon layer by etching aside from said cap using said cap as a mask thereby removing material not protected by said cap.

5. The method of claim 1 including the steps comprising:

prior to forming said tunnel oxide layer, form Field OXide (FOX) regions and then form active regions in said substrate, form said mask layer from silicon nitride, form said mask layer on said upper surface of said first polysilicon layer by forming a polysilicon oxide cap on said upper surface of said first polysilicon layer through said window, and form said floating gate electrode stack by etching said native oxide, said first polysilicon layer and said tunnel oxide layer down to said substrate using said cap as a mask to form said floating gate electrode stack.

6. A method of forming split gate electrode MOS FET devices including the steps comprising:

form a tunnel oxide layer over a semiconductor substrate, form a doped first polysilicon layer over said tunnel oxide layer followed by development of a native oxide layer upon said upper surface of said first polysilicon layer, said first polysilicon layer having an Field OXide (FOX) surface, etch said native oxide layer from said first polysilicon layer, form a mask layer over said first polysilicon layer by etching, form a cell-defining mask over said mask layer with a opening therethrough where a floating gate electrode stack is to be formed, etch through said opening in said cell-defining mask to form a window through said mask layer and said native oxide down and slightly into said upper surface of said first polysilicon layer leaving slight depressions therein, form a cap over said upper surface of said first polysilicon layer after removal of said native oxide layer, said cap having narrow encroachment wings on the lateral portions thereof, pattern a floating gate electrode stack formed by said tunnel oxide layer and said first polysilicon layer in a pattern of said cap with a bird's beak peak on the periphery of said upper surface of said first polysilicon layer, form inter-polysilicon dielectric and control gate layers over exposed portions of said substrate and covering said floating gate electrode stack, pattern said inter-polysilicon dielectric and control gate layers into adjacent mirror image split gate electrode pairs, and form source and drain regions self-aligned with said gate electrode stack.

7. The method of claim 6 including the steps comprising:

form said cap of polysilicon oxide (polyoxide), pattern said tunnel oxide layer and said first polysilicon layer in a subtractive process using said cap as a mask thereby removing material not protected by said mask.

8. The method of claim 6 including the steps comprising:

form said cap of polysilicon oxide (polyoxide), form a silicon nitride floating gate mask over said first polysilicon layer to pattern said polyoxide cap, and pattern said tunnel oxide layer and said first polysilicon layer in a subtractive process aside from said polyoxide cap thereby removing material not protected by said polyoxide cap.

9. The method of claim 6 including the steps comprising:

form said cap of polysilicon oxide (polyoxide), form a silicon nitride floating gate mask over said upper surface of said first polysilicon layer, and etch said tunnel oxide layer and said first polysilicon layer aside from said polyoxide cap thereby removing material not protected by said polyoxide cap thereby forming said floating gate electrode.

10. The method of claim 6 including the steps comprising:

form long upper Field OXide (FOX) regions and then form active regions in said substrate prior to forming said tunnel oxide layer, form said mask layer of silicon nitride, form said cap as a polysilicon oxide (polyoxide) cap on and in said first polysilicon layer, etch said tunnel oxide layer and said first polysilicon layer using said cap as a mask to form said floating gate electrode stack, said bird's beak having a width of about 700 Å to at a depth of about 1200 Å below said peak, and the angles of the inner walls of said bird's beak peak are from about 5° to about 15°.

11. A method of forming split gate electrode MOS FET devices including the steps in the sequence as follows:

form a tunnel oxide layer over a semiconductor substrate, form a doped first polysilicon layer, having an upper surface over said tunnel oxide layer, followed by development of a native oxide layer upon said upper surface of said first polysilicon layer, remove said native oxide from said first polysilicon layer, form a mask layer over said first polysilicon layer, form a cell-defining mask over said first polysilicon layer with a opening therethrough where a floating gate electrode stack is to be formed, etch through said opening in said cell-defining mask to form a window through said mask layer down to said upper surface of said first polysilicon layer, form a cap on said upper surface of said first polysilicon layer at the bottom of said window, where a floating gate electrode stack is to be formed, strip said mask layer from said first polysilicon layer, remove portions of said tunnel oxide layer and said first polysilicon layer aside from said cap thereby forming a floating gate electrode stack with a sharp bird's beak peak on the periphery of said upper surface of said first polysilicon layer, form an inter-polysilicon dielectric layer and a control gate layer over exposed portions of said substrate and covering said floating gate electrode stack, pattern said inter-polysilicon dielectric layer and said control gate layer into a split gate electrode, form a source region self-aligned with said floating gate electrode stack, and form a drain region self-aligned with said split gate electrode.

12. The method of claim 11 including the steps comprising:

oxidize said first polysilicon layer through said mask layer to form said cap of polysilicon oxide in and on said upper surface of said first polysilicon layer, and then pattern said tunnel oxide layer and said floating gate electrode stack in a subtractive process using said polysilicon oxide cap as a mask thereby removing material not protected by said polysilicon oxide cap.

13. The method of claim 11 including the steps comprising:

form said mask layer from silicon nitride, form said cap in and on said upper surface of said first polysilicon layer by forming a polysilicon oxide in and on said upper surface of said first polysilicon layer through said window, and pattern said tunnel oxide layer and said first polysilicon layer in a subtractive process removing material not protected by said cap.

14. The method of claim 11 including the steps comprising:

form said mask layer from silicon nitride, and after forming said window in said silicon nitride, then strip said cell defining mask, form said cap in and on said upper surface of said first polysilicon layer by forming a polysilicon oxide cap in and on said upper surface of said first polysilicon layer through said window, and pattern said tunnel oxide layer and said first polysilicon layer by etching aside from said cap using said cap as a mask thereby removing material not protected by said cap.

15. The method of claim 11 including the steps comprising:

prior to forming said tunnel oxide layer, form Field OXide (FOX) regions and then form active regions in said substrate, form said mask layer from silicon nitride, form said mask layer on said upper surface of said first polysilicon layer by forming a polysilicon oxide cap on said upper surface of said first polysilicon layer through said window, and form said floating gate electrode stack by etching said first polysilicon layer and said tunnel oxide layer down to said substrate using said cap as a mask to form said floating gate electrode stack.

16. A method of forming split gate electrode MOS FET devices including the steps comprising:

form a tunnel oxide layer over a semiconductor substrate, form a doped first polysilicon layer over said tunnel oxide layer followed by development of a native oxide layer upon said upper surface of said first polysilicon layer, said first polysilicon layer having an Field OXide (FOX) surface, etch said native oxide layer from said first polysilicon layer, form a mask layer over said first polysilicon layer by etching, form a cell-defining mask over said mask layer with a opening therethrough where a floating gate electrode stack is to be formed, etch through said opening in said cell-defining mask to form a window through said mask layer down and slightly into said upper surface of said first polysilicon layer leaving slight depressions therein, form a cap over said upper surface of said first polysilicon layer, said cap having narrow encroachment wings on the lateral portions thereof, pattern a floating gate electrode stack formed by said tunnel oxide layer and said first polysilicon layer in a pattern of said cap with a sharp bird's beak peak on the periphery of said upper surface of said first polysilicon layer, form inter-polysilicon dielectric and control gate layers over exposed portions of said substrate and covering said floating gate electrode stack, pattern said inter-polysilicon dielectric and control gate layers into adjacent mirror image split gate electrode pairs and form source and drain regions self-aligned with said gate electrode stack.

17. The method of claim 16 including the steps comprising:

form said cap of polysilicon oxide (polyoxide), pattern said tunnel oxide layer and said first polysilicon layer in a subtractive process using said cap as a mask thereby removing material not protected by said mask.

18. The method of claim 16 including the steps comprising:

form said cap of polysilicon oxide (polyoxide), form a silicon nitride floating gate mask over said first polysilicon layer to pattern said polyoxide cap, and pattern said tunnel oxide layer and said first polysilicon layer in a subtractive process aside from said polyoxide cap thereby removing material not protected by said polyoxide cap.

19. The method of claim 16 including the steps comprising:

form said cap of polysilicon oxide (polyoxide), form a silicon nitride floating gate mask over said upper surface of said first polysilicon layer, and etch said tunnel oxide layer and said first polysilicon layer aside from said polyoxide cap thereby removing material not protected by said polyoxide cap thereby forming said floating gate electrode.

20. The method of claim 16 including the steps comprising:

form long upper Field OXide (FOX) regions and then form active regions in said substrate prior to forming said tunnel oxide layer, form said mask layer of silicon nitride, form said cap as a polysilicon oxide (polyoxide) cap on and in said first polysilicon layer, etch said tunnel oxide layer and said first polysilicon layer using said cap as a mask to form said floating gate electrode stack, said bird's beak having a width of about 700 Å to at a depth of about 1200 Å below said peak, and the angles of the inner walls of said bird's beak peak are from about 5° to about 15°.

* * * * *